United States Patent
Ohguro et al.

(10) Patent No.: US 7,923,788 B2
(45) Date of Patent: Apr. 12, 2011

(54) SEMICONDUCTOR DEVICE

(75) Inventors: Tatsuya Ohguro, Yokohama (JP);
Takashi Izumida, Yokohama (JP);
Satoshi Inaba, Yokohama (JP);
Kimitoshi Okano, Yokohama (JP);
Nobutoshi Aoki, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 287 days.

(21) Appl. No.: 12/207,121

(22) Filed: Sep. 9, 2008

(65) Prior Publication Data
US 2009/0065869 A1 Mar. 12, 2009

(30) Foreign Application Priority Data
Sep. 10, 2007 (JP) ................. 2007-233989

(51) Int. Cl.
*H01L 21/28* (2006.01)
*H01L 29/08* (2006.01)
(52) U.S. Cl. ........ 257/401; 257/368; 257/213; 257/288; 257/E29.04; 257/E21.176; 438/151; 438/163
(58) Field of Classification Search .............. 257/401, 257/368, 213, 288, E29.04, E21.176; 438/151, 438/163
See application file for complete search history.

(56) References Cited

U.S. PATENT DOCUMENTS

| | | | |
|---|---|---|---|
| 7,241,653 B2 * | 7/2007 | Hareland et al. | 438/199 |
| 7,312,502 B2 * | 12/2007 | Clark et al. | 257/347 |
| 7,560,756 B2 * | 7/2009 | Chau et al. | 257/287 |
| 7,611,932 B2 * | 11/2009 | Yin et al. | 438/166 |
| 7,714,397 B2 * | 5/2010 | Hareland et al. | 257/401 |
| 7,838,948 B2 * | 11/2010 | Gossner | 257/401 |
| 2005/0127362 A1 | 6/2005 | Zhang et al. | |
| 2006/0073647 A1 | 4/2006 | Inaba | |
| 2008/0050897 A1 * | 2/2008 | Kottantharayil | 438/513 |

FOREIGN PATENT DOCUMENTS

| | | |
|---|---|---|
| JP | 7-86307 | 3/1995 |
| JP | 2006-19576 | 1/2006 |
| JP | 2006-100731 | 4/2006 |

OTHER PUBLICATIONS

U.S. Appl. No. 12/494,885, filed Jun. 30, 2009, Inaba.

* cited by examiner

*Primary Examiner* — Victor Mandala
(74) *Attorney, Agent, or Firm* — Oblon, Spivak, McClelland, Maier & Neustadt, L.L.P.

(57) ABSTRACT

A semiconductor device has a plurality of fins formed on a semiconductor substrate to be separated from each other, a first contact region which connects commonly one end side of the plurality of fins, a second contact region which connects commonly the other end side of the plurality of fins, a gate electrode arranged to be opposed to at least both side surfaces of the plurality of fins by sandwiching a gate insulating film therebetween, a source electrode including the first contact region and the plurality of fins on a side closer to the first contact region than the gate electrode, and a drain electrode including the second contact region and the plurality of fins on a side closer to the second contact than the gate electrode. The ratio Rd/Rs of a resistance Rd of each fin in the drain region to a resistance Rs of each fin in the source region is larger than 1.

20 Claims, 8 Drawing Sheets

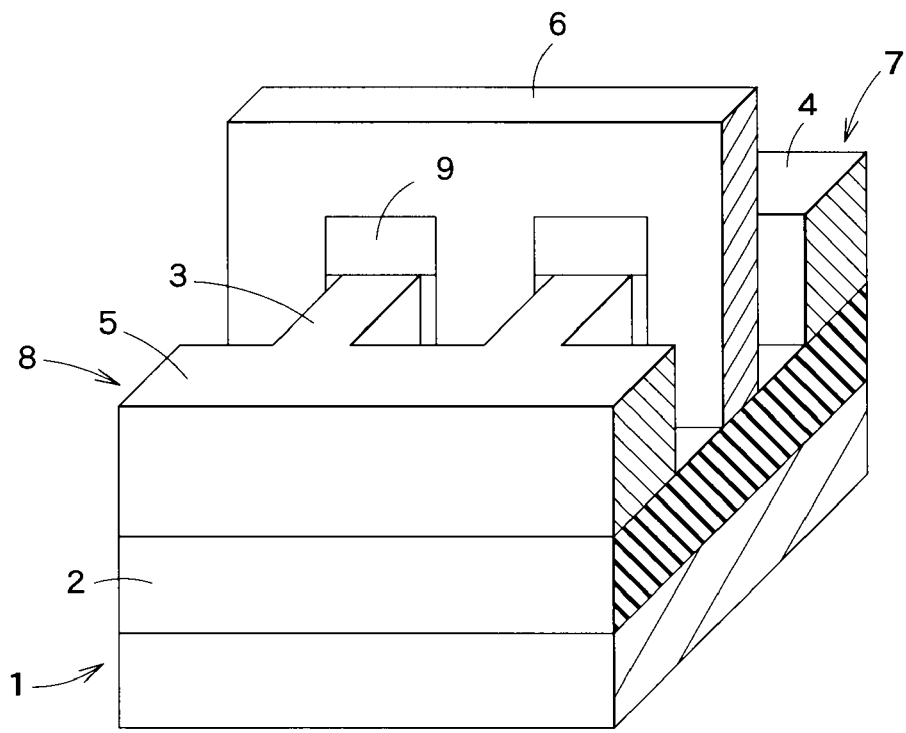
F I G. 1A
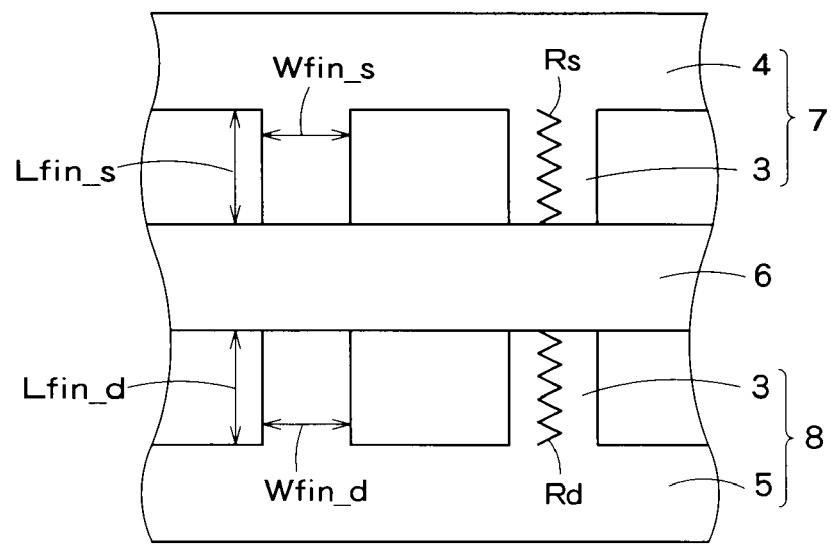
F I G. 1B

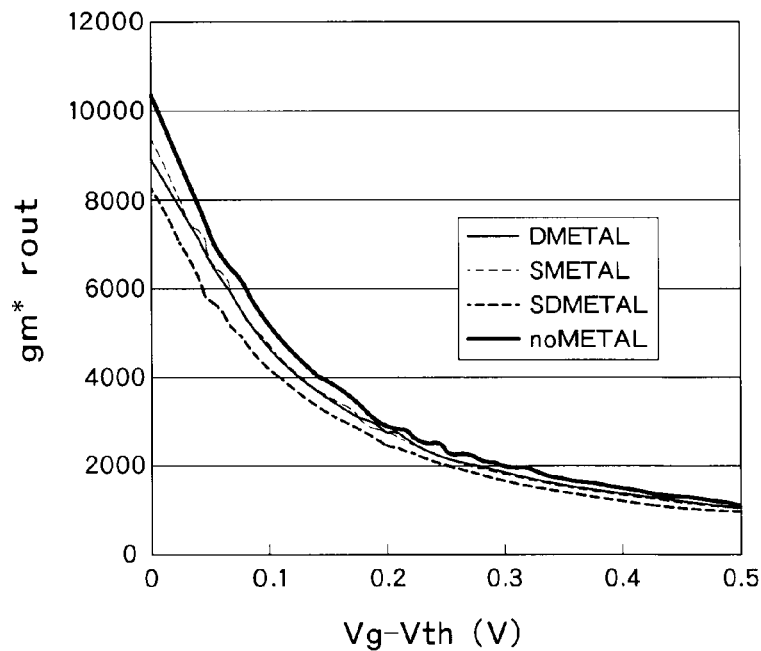
F I G. 2A
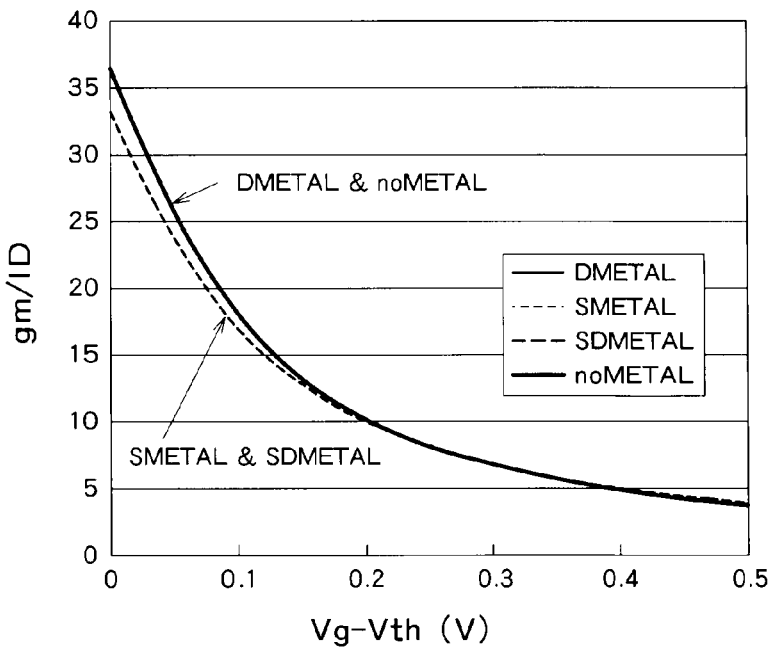
DMETAL = LOW RESISTANCE ON DRAIN SIDE ONLY (10ohm/□)
SMETAL = LOW RESISTANCE ON SOURCE SIDE ONLY (10ohm/□)
SDMETAL = LOW RESISTANCE ON BOTH OF SOURCE AND DRAIN SIDES (10ohm/□)
noMETAL = HIGH RESISTANCE ON BOTH OF SOURCE AND DRAIN SIDES (100ohm/□)
F I G. 2B

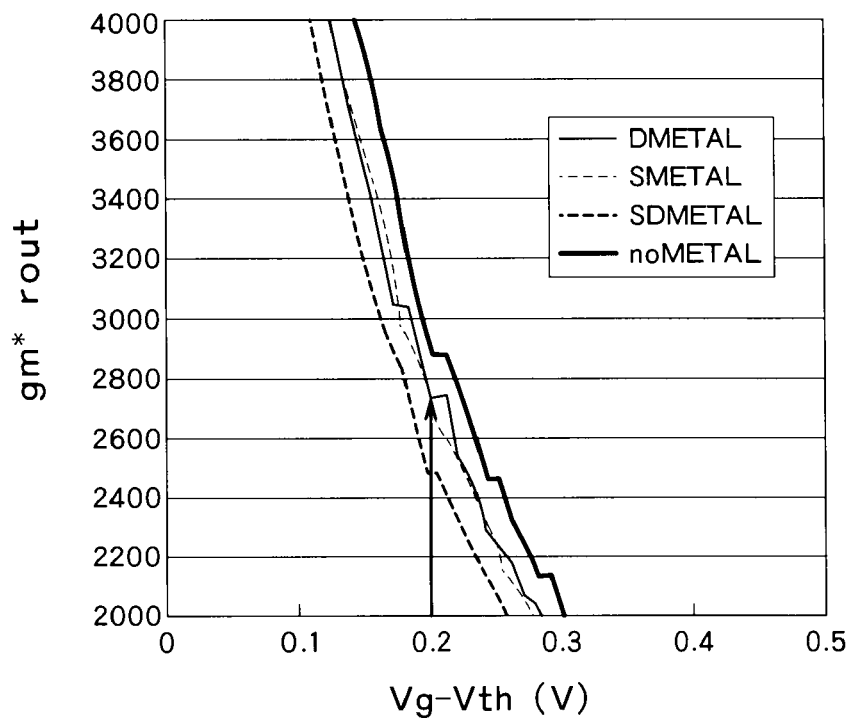
F I G. 3A
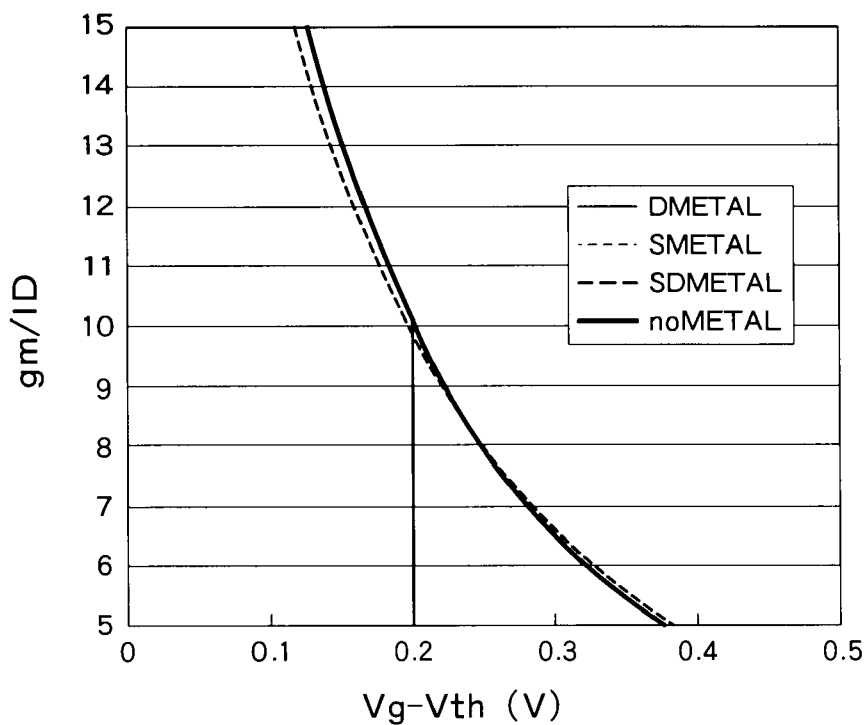
F I G. 3B

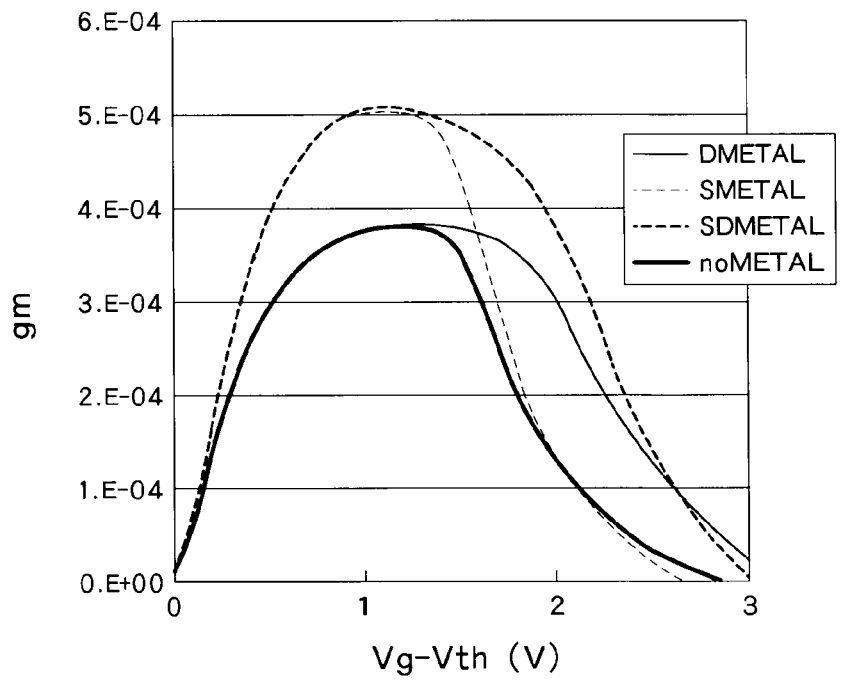
F I G. 4A
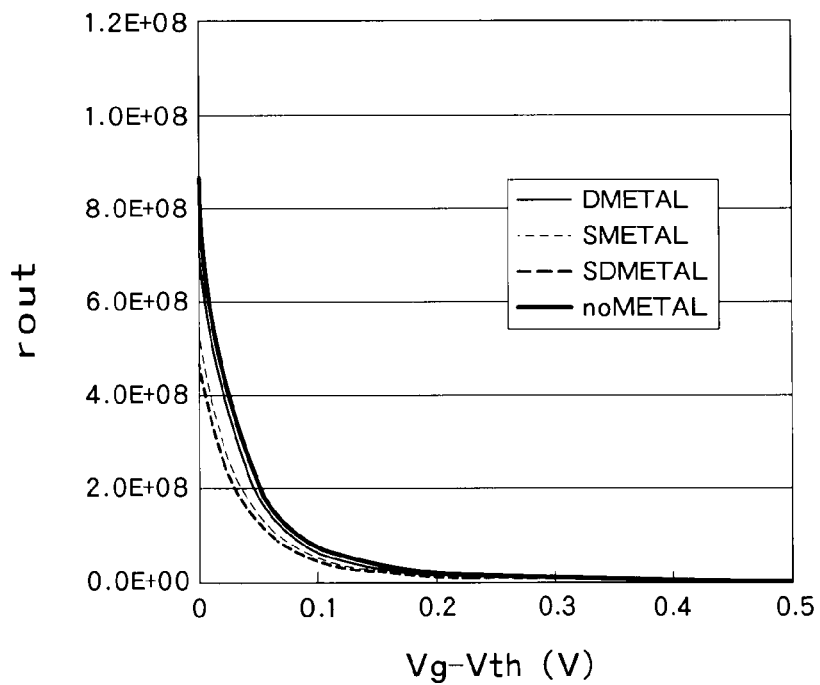
DMETAL = LOW RESISTANCE ON DRAIN SIDE ONLY (10ohm/□)
SMETAL = LOW RESISTANCE ON SOURCE SIDE ONLY (10ohm/□)
SDMETAL = LOW RESISTANCE ON BOTH OF SOURCE AND DRAIN SIDES (10ohm/□)
noMETAL = HIGH RESISTANCE ON BOTH OF SOURCE AND DRAIN SIDES (100ohm/□)
F I G. 4B

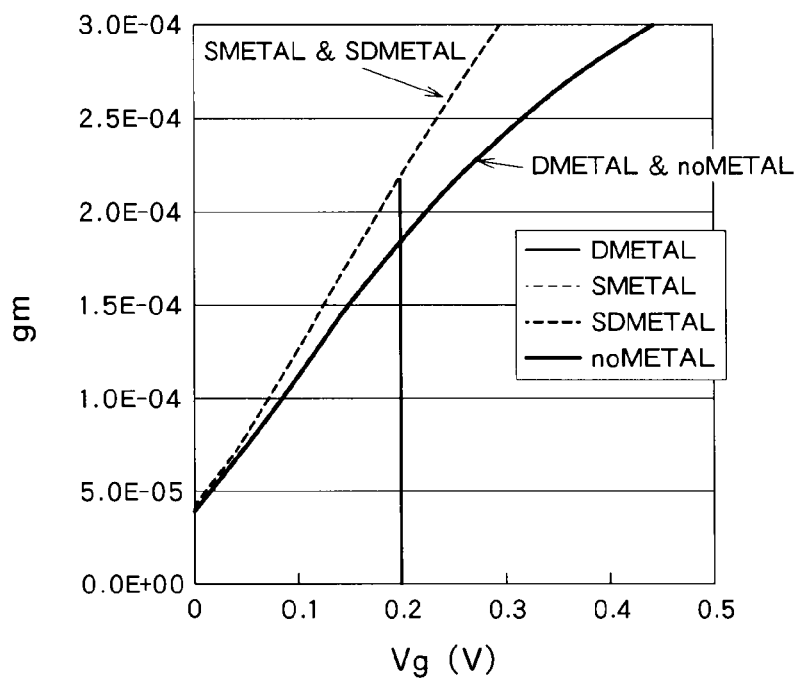
F I G. 5
| Source | Drain | gm | gm* rout | gm/Id |
|---|---|---|---|---|
| LOW RESISTANCE | LOW RESISTANCE | 1 | 1 | 1 |
| HIGH RESISTANCE | LOW RESISTANCE | 0.7 | 1.12 | 1 |
| LOW RESISTANCE | HIGH RESISTANCE | 1 | 1.12 | 1 |
| HIGH RESISTANCE | HIGH RESISTANCE | 0.7 | 1.16 | 1 |
F I G. 6
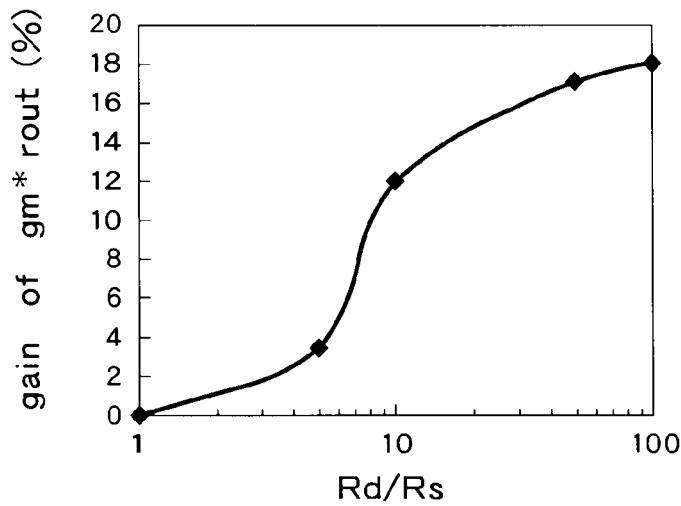
F I G. 7

| | Q1 | Q2 | Q3 | Q4 | Q5 | Q6 | Q7 |
|---|---|---|---|---|---|---|---|
| Lg (nm) | 10 | 10 | 10 | 10 | 10 | 10 | 10 |
| H_s (nm) | 50 | 50 | 50 | 50 | 50 | 50 | 50 |
| H_d (nm) | 50 | 50 | 50 | 50 | 50 | 50 | 50 |
| Lfin_s (nm) | 100 | 100 | 100 | 100 | 100 | 100 | 100 |
| Lfin_d (nm) | 100 | 100 | 100 | 1000 | 500 | 100 | 100 |
| Wfin_s (nm) | 20 | 20 | 20 | 20 | 20 | 20 | 20 |
| Wfin_d (nm) | 20 | 2 | 2 | 2 | 10 | 2 | 2 |
| C_s (cm-2) | 1.00E+21 | 1.00E+21 | 1.00E+21 | 1.00E+21 | 1.00E+21 | 1.00E+21 | 1.00E+21 |
| C_d (cm-2) | 1.00E+21 | 1.00E+21 | 1.00E+21 | 1.00E+21 | 1.00E+21 | 1.00E+21 | 1.00E+20 |
| M_s | WITH SILICIDE | WITH SILICIDE | WITH SILICIDE | WITH SILICIDE | WITH SILICIDE | WITH SILICIDE | WITH SILICIDE |
| M_d | WITH SILICIDE | WITH SILICIDE | WITH SILICIDE | WITH SILICIDE | WITH SILICIDE | WITHOUT SILICIDE | WITHOUT SILICIDE |
| SOURCE RESISTANCE Rs(ohm) | 100 | 100 | 50 | 100 | 100 | 100 | 100 |
| DRAIN RESISTANCE Rd(ohm) | 100 | 1000 | 1000 | 10000 | 1000 | 20000 | 200000 |
| Rd/Rs | 1.0 | 10.0 | 20.0 | 100.0 | 10.0 | 200.0 | 2000.0 |

SEMICONDUCTOR DEVICE

CROSS REFERENCE TO RELATED APPLICATIONS

This application is based upon and claims the benefit of priority from the prior Japanese Patent Application No. 2007-233989, filed on Sep. 10, 2007, the entire contents of which are incorporated herein by reference.

BACKGROUND OF THE INVENTION

In recent years, attention has been directed toward a double gate transistor having a channel and a source/drain region within a fin to restrain short channel effect (see JP-A (Kokai) No. 2006-100731.) However, there has never been proposed an example of reviewing in detail optimum structure of the double gate transistor having as large output resistance as possible.

For example, paragraph 0061 and FIG. 12 of the above patent document disclose an example in which the fin width on the source side is made thicker than that on the drain side, and the fin length on the drain side is made shorter than that on the source side, thereby balancing the resistance on the source side and that on the drain side. Since the structure in the above patent document is not formed in consideration of the output resistance, it cannot be guaranteed that the output resistance is increased with the structure in the above patent document.

SUMMARY OF THE INVENTION

According to one aspect of the present invention, a semiconductor device comprising: a plurality of fins formed on a semiconductor substrate to be separated from each other; a first contact region which connects commonly one end side of the plurality of fins; a second contact region which connects commonly the other end side of the plurality of fins; a gate electrode arranged to be opposed to at least both side surfaces of the plurality of fins by sandwiching a gate insulating film therebetween; a source electrode including the first contact region and the plurality of fins on a side closer to the first contact region than the gate electrode; and a drain electrode including the second contact region and the plurality of fins on a side closer to the second contact than the gate electrode, wherein a ratio Rd/Rs of a resistance Rd of each fin in the drain region to a resistance Rs of each fin in the source region is larger than 1.

According to one aspect of the present invention, a method of fabricating a semiconductor device comprising: forming a plurality of fins separated from each other, a first contact region connecting commonly one end side of the plurality of fins and a second contact region connecting commonly the other end side of the plurality of fins on a semiconductor substrate; forming a gate electrode to be arranged to be opposed to at least both side surfaces of the plurality of fins by sandwiching a gate insulating film therebetween; and adjusting at least one of the plurality of fins in the drain region and the source region so that a ratio Rd/Rs of a resistance Rd of each fin in the drain region including the second contact region and the plurality of fins on a side closer to the second contact region than the gate electrode to a resistance Rs of each fin in the source region including the first contact region and the plurality of fins on a side closer to the first contact region than the gate electrode becomes more than 1.

BRIEF DESCRIPTION OF THE DRAWINGS

FIG. 1A is a perspective diagram of a transistor used in the measurement of electric characteristics thereof, and FIG. 1B is a plane view of FIG. 1A.

FIG. 2A and FIG. 2B are graphs showing gm*rout and gm/Id of four kinds of transistors having the structure in FIG. 1.

FIG. 3A and FIG. 3B are enlarged graphs of FIG. 2A and FIG. 2B showing wave patterns in the range where Vg minus Vth is around 0.2V.

FIG. 4A is a graph showing transconductance gm of the above four kinds of transistors, and FIG. 4B is a graph showing output resistance rout.

FIG. 5 is an enlarged graph of FIG. 4A showing wave patterns in the range where Vg minus Vth is around 0.2V.

FIG. 6 is a diagram summarizing the results in FIG. 2 to 5.

FIG. 7 is a diagram showing gm*rout against Rd/Rs.

FIG. 8 is a diagram summarizing the requirements to make Rd/Rs become 10 or more.

DETAILED DESCRIPTION OF THE INVENTION

Figure 9:
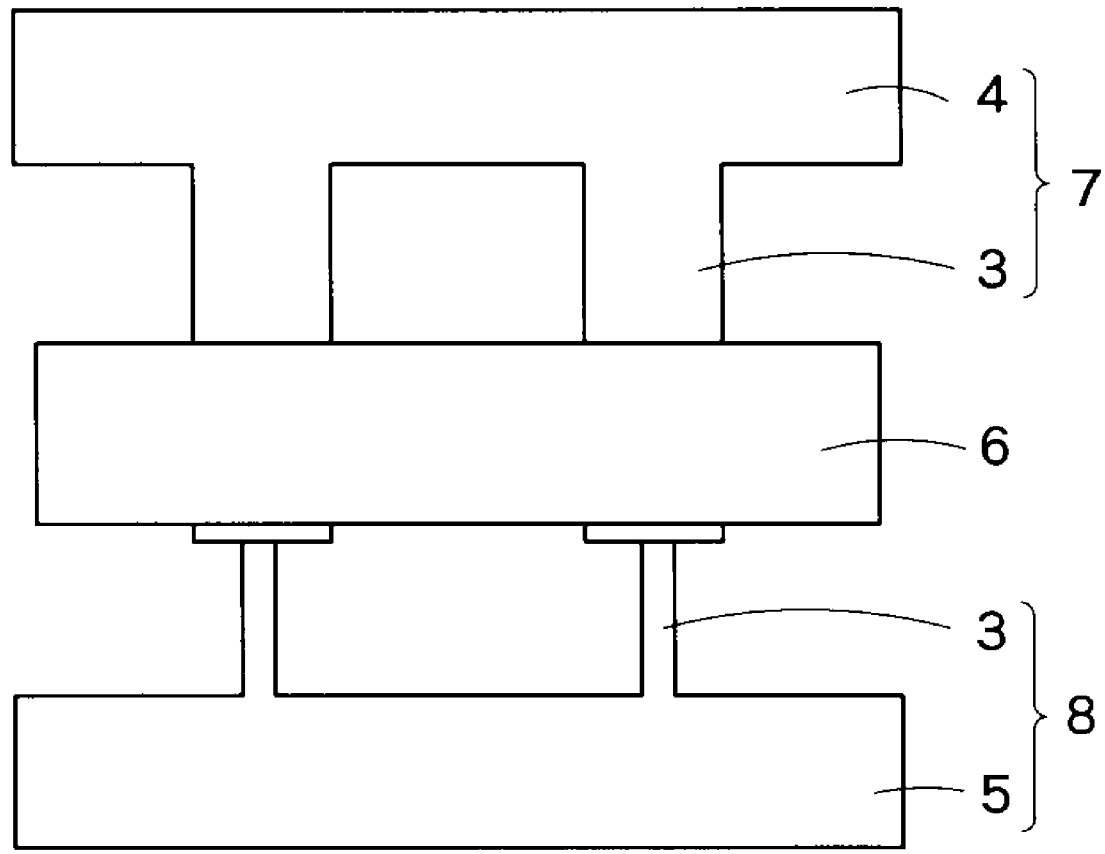
FIG. 9 is a plane view showing an example of a semiconductor device which meets the requirements to realize Rd/Rs≧10.

Hereinafter, embodiments of the present invention will be described with reference to the accompanying drawings.

When using MISFETs or MOSFETs in an analog circuit, it is desirable that a gain, which is expressed by the ratio of output voltage vout to input voltage vin, becomes as large as possible. The gain can be expressed as the following Equation (1).

$$vout/vin = gm * rout \quad (1)$$

Here, gm represents a transconductance, and rout represents an output resistance.

Equation (1) shows that transconductance gm or output resistance rout should be increased in order to increase the gain. Although transconductance gm and output resistance rout change when device structure is changed, output resistance rout changes greater than transconductance gm. Accordingly, output resistance rout is important in order to increase the gain.

When output resistance rout of a circuit using MISFETs or MOSFETs is small, an output signal fluctuates when noise such as jitter is added to a power supply voltage.

The inventors of the present invention has measured gm*rout and gm/Id of a transistor having a multi-fin structure and a double gate structure by variously changing the resistance on the source side and that on the drain side.

FIG. 1A is a perspective diagram of a transistor used in the measured electric characteristics, and FIG. 1B is a plane view of FIG. 1A. First, the structure of the transistor used in the measurement will be explained hereinafter with reference to FIG. 1A and FIG. 1B. This transistor includes: multiple fins 3, each of which is formed separately on an embedded oxide film 2 of an SOI substrate 1; a first contact region 4 for commonly connecting one end side of the fins 3; a second contact region 5 for commonly connecting the other end side of the fins 3; a gate electrode 6 arranged to straddle the fins 3; a source region 7 including the first contact region 4 and the fins 3 on the first contact region 4 side from the gate electrode 6; and a drain region 8 including the second contact region 5 and the fins 3 on the second contact region 5 side from the gate electrode 6.

The gate electrode 6 is arranged to be opposed to the side surfaces and the top surface of the multiple fins 3 with a gate insulating film 9 sandwiched therebetween respectively. Note that the gate electrode 6 should not necessarily be arranged to be opposed to the top surface of the multiple fins 3. The gate electrode 6 may be arranged to be opposed only to the side surfaces of the multiple fins 3.

The first contact region 4, the second contact region 5, and the multiple fins 3 are formed of silicon layers.

FIG. 2 illustrates graphs showing gm*rout and gm/Id of four kinds of transistors having the structure in FIG. 1. In FIG. 2A, the horizontal axis represents Vg-Vth [V], and the vertical axis represents gm*rout. In FIG. 2B, the horizontal axis represents Vg-Vth [V], and the vertical axis represents gm/Id. Vg represents a gate voltage of the transistors, Vth represents a threshold voltage, and Id represents a drain electric current.

Four kinds of transistors in FIG. 2 will be described hereinafter. A transistor DMETAL is formed so that the resistance on the drain side from the gate electrode 6 becomes lower than that on the source side, a transistor SMETAL is formed, contrary to the transistor DMETAL, so that the resistance on the source side becomes lower than that on the drain side, a transistor SDMETAL is formed so that the resistances on both of the source and drain sides become low, and a transistor noMETAL is formed so that the resistances on both of the source and drain sides become high.

FIG. 3A and FIG. 3B are enlarged graphs of FIG. 2A and FIG. 2B showing wave patterns in the range where Vg minus Vth is around 0.2V. The voltage range around 0.2V is most frequently used in analog circuits, which is the reason why the voltage range around 0.2V is selected.

In FIG. 3A, the transistor SDMETAL is most frequently used. When comparing the transistor SDMETAL with the transistor SMETAL, gm*rout is increased by about 12% when the resistance is made high only on the drain side, compared to when the resistances on both of the source and drain sides are made low.

In FIG. 3B, on the other hand, when comparing the transistor SDMETAL with the transistor SMETAL, gm/Id scarcely changes when the resistance on the drain side is made high or low.

FIG. 4A is a graph showing transconductance gm of the above four kinds of transistors, and FIG. 4B is a graph showing output resistance rout. In each graph, the horizontal axis represents Vg-Vth [V].

FIG. 5 is an enlarged graph of FIG. 4A showing wave patterns in the range where Vg minus Vth is around 0.2V. As shown in FIG. 5, the wave patterns of the transistor SDMETAL and the transistor SMETAL overlap each other, and gm scarcely changes when the resistance on the drain side is made high or low.

FIG. 6 is a diagram summarizing the results in FIG. 2 to FIG. 5 and showing the values of gm, gm*rout, and gm/Id when Vg-Vth=0.2V. The values described in FIG. 6 are not absolute values but relative values. Concretely, each of gm, gm*rout, and gm/Id when the resistances on both of the source and drain sides are made low is assumed to be 1, and the relative values of gm, etc. when the resistances on the source and drain sides are changed are shown.

As shown in FIG. 6, when the resistance is made high only on the drain side, gm*rout can be increased by about 12% with each of gm and gm/Id being kept constant. There is no doubt that the increase of gm*rout by about 12% with gm kept constant is equivalent to the increase of output resistance rout by about 12%.

On the other hand, gm*rout becomes larger when the resistances are made high on both of the source and drain sides than when the resistance is made high only on the drain side, while gm is decreased by about 30%. It is undesirable for gm to be decreased, since the decrease in gm deteriorates the performance of the transistor. Therefore, FIG. 6 shows that it is most desirable to make the resistance high only on the drain side.

FIG. 7 is a diagram showing gm*rout against Rd/Rs, which is the value showing the ratio of the resistance of the fins on the drain side (hereinafter, referred to as drain resistance Rd) to the resistance of the fins on the source side (hereinafter, referred to as source resistance Rs). As apparent from FIG. 7, gm*rout increases monotonously when the drain resistance Rd becomes higher than the source resistance Rs. Especially, gm*rout suddenly becomes larger when the ratio value of drain resistance Rd to source resistance Rs becomes 10 or more. Therefore, the minimum required condition for increasing gm*rout is Rd>Rs. It can be concluded that the minimum required condition for increasing gm*rout is Rd>Rs, and preferably, Rd/Rs≧10 should be satisfied in order to increase gm*rout. When Rd/Rs is satisfied, a voltage on the drain end in the gate electrode lowers, and the short channel effect is restrained, thereby increasing gm*rout.

FIG. 8 is a diagram summarizing the requirements for setting Rd/Rs to 10 or more. In FIG. 8, the leftmost column shows various coefficient values characterizing transistors. Seeing the coefficient values sequentially from the top, Lg (nm) represents the gate length, H_s (nm) represents the height of the fins 3 on the source side, H_d represents the height of the fins 3 on the drain side, Lfin_s (nm) represents the length of the fins 3 on the source side, Lfin_d (nm) represents the length of the fins 3 on the drain side, Wfin_s (nm) represents the width of the fins 3 on the source side, Wfin_d (nm) represents the width of the fins 3 on the drain side, C_s ($cm^{-2}$) represents the impurity density of the fins 3 on the source side, C_d ($cm^{-2}$) represents the impurity density of the fins 3 on the drain side, M_s represents the existence or nonexistence of a silicide layer on the source side surface, M_d represents the existence or nonexistence of a silicide layer on the drain side surface, Rs (ohm) represents the source resistance, Rd (ohm) represents the drain resistance, and Rd/Rs is shown in the last.

A transistor Q1 is a reference transistor, which is formed so that a silicide layer is formed on both the source side surface and the drain side surface, each of source resistance Rs and drain resistance Rd is 100 ohm, and Rd/Rs=1.0.

A transistor Q2 is formed so that Wfin_d (nm) representing the width of the fins 3 on the drain side becomes 1/10 compared to the transistor Q1. Accordingly, drain resistance Rd becomes 10 times, and Rd/Rs also becomes 10 times.

A transistor Q3 is formed so that H_s representing the height of the fins 3 on the source side becomes 2 times and Wfin_d (nm) representing the width of the fins 3 on the drain side becomes 1/10, compared to the transistor Q1. Accordingly, source resistance Rs becomes ½, drain resistance Rd becomes 10 times, and Rd/Rs becomes 20 times.

A transistor Q4 is formed so that Lfin_d (nm) representing the length of the fins 3 on the drain side becomes 10 times and Wfin_d (nm) representing the width of the fins 3 on the drain side becomes 1/10, compared to the transistor Q1. Accordingly, drain resistance Rd becomes 100 times, and Rd/Rs also becomes 100 times.

A transistor Q5 is formed so that Lfin_d (nm) representing the length of the fins 3 on the drain side becomes 5 times and Wfin_d (nm) representing the width of the fins 3 on the drain side becomes ½, compared to the transistor Q1. Accordingly, drain resistance Rd becomes 10 times, and Rd/Rs also becomes 10 times.

A transistor Q6 is formed so that Wfin_d (nm) representing the width of the fins 3 on the drain side becomes 1/10 compared to the transistor Q1 and the silicide layer is not formed on the drain side surface. Accordingly, drain resistance Rd becomes 200 times, and Rd/Rs also becomes 200 times.

A transistor Q7 is formed, in addition to the requirements of the transistor Q6, so that C_d representing the impurity density of the fins 3 on the drain side becomes 1/10 compared to the transistor Q1. Accordingly, drain resistance Rd becomes 2000 times, and Rd/Rs also becomes 2000 times.

FIG. 8 shows that at least one of the following requirements is needed in order to set Rd/Rs to 10 or more.

(1) The width of the fins 3 on the drain side is made narrower than the width of the fins 3 on the source side.

(2) The length of the fins 3 on the drain side is made longer than the length of the fins 3 on the source side.

(3) The height of the fins 3 on the drain side is made low.

(4) The silicide layer is not formed on the fins 3 only on the drain side.

(5) The impurity density of the fins 3 on the drain side is decreased.

It is possible to set Rd/Rs to 10 or more eventually by arbitrarily combining the above requirements (1) to (5). Note that the above requirement (1) is simple and easy especially in adjusting the resistance of the fins 3 on the source side and that on the drain side. Therefore, it is also possible to set Rd/Rs to 10 or more by arbitrarily adopting the requirements (2) to (5) while meeting the requirement (1).

FIG. 9 is a plane view showing an example of a semiconductor device which meets the requirements to realize Rd/Rs≧10, in which the width of the fins 3 on the drain side is set to 1/10 or below compared to the width of the fins 3 on the source side. This example corresponds to the above requirement (1) and can be manufactured easily by making the width of the fin 3 on the drain 8 side narrower than the width of the fin 3 on the source 7 side. Note that the above requirements (1) and (2) can be met at the same time if a plane pattern in which the width and length of the fins 3 on the drain side are narrower and longer than those on the source side is formed.

The semiconductor device meeting at least one of the requirements (1) to (5) can be formed of the following processes. First, a plurality of fins 3 separated from each other, the first contact region 4 connecting commonly one end sides of the fins 3, and the second contact region 5 connecting commonly the other end sides of the fins 3 are formed on the semiconductor substrate.

Next, the gate electrode 6 is formed so that it is arranged to be opposed to at least both the side surfaces of the fins 3 by sandwiching the gate electrode 9 therebetween.

Next, at least one of the fin 3 in the drain region 8 and the fin 3 in the source region 7 is adjusted so that the ratio Rd/Rs of the resistance Rd to the resistance Rs is more than 1, preferably, is 10 or more.

FIG. 10 illustrates manufacturing process diagrams showing another example of the semiconductor device which meets the requirements to realize Rd/Rs≧10, in which a silicide layer is formed only on the source side to make the resistance low. First, the multiple fins 3, the first contact region 4, the second contact region 5, the gate insulating film 9 and the gate electrode 6 are formed, and then an SiN film 11 is formed on the whole surfaces of the substrate. Next, only the top surface on the drain side is covered by an insulation film 12. FIG. 10A is a plane view showing this state, and FIG. 10B shows a sectional view along A-A in FIG. 10A.

Next, RIE (Reactive Ion Etching) is performed to remove the SiN film 11 in the region where the SiN film 11 is not covered by the insulation film 12 to expose a silicon layer 13 on the source side. After that, the insulation film 12 is removed and an epitaxial growth layer 15 made of silicon is formed by making epitaxial growth on the silicon layer 13 in the source region 7 in the side and top directions.

Figure 10A:
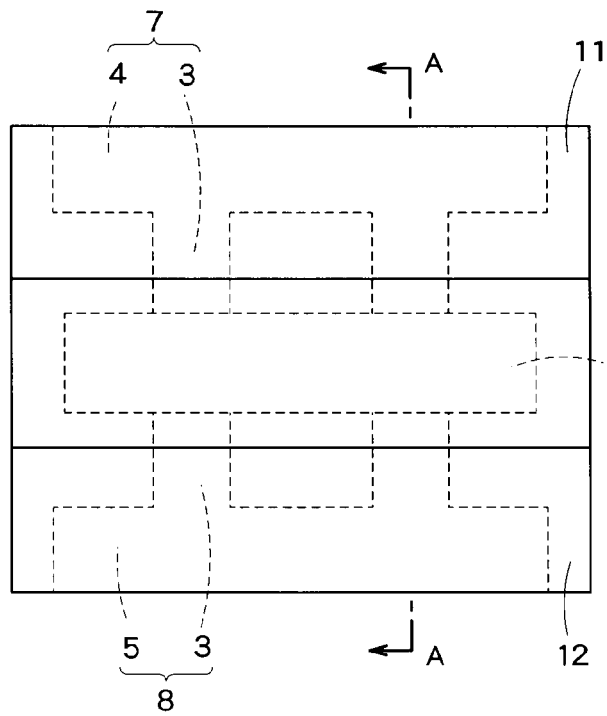
FIG. 10A to FIG. 10D are manufacturing process diagrams showing another example of the semiconductor device which meets the requirements to realize Rd/Rs≧10.
Figure 10B:
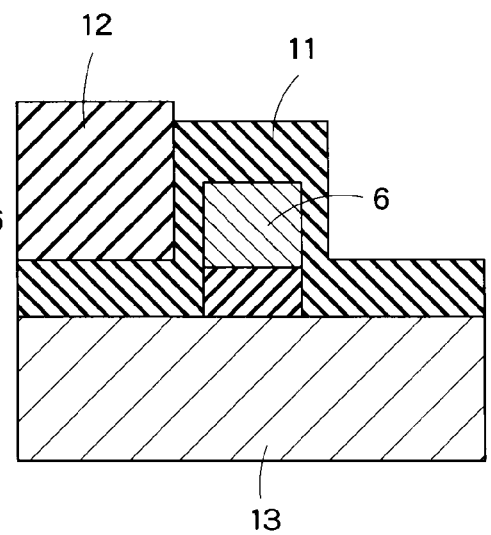
Figure 10C:
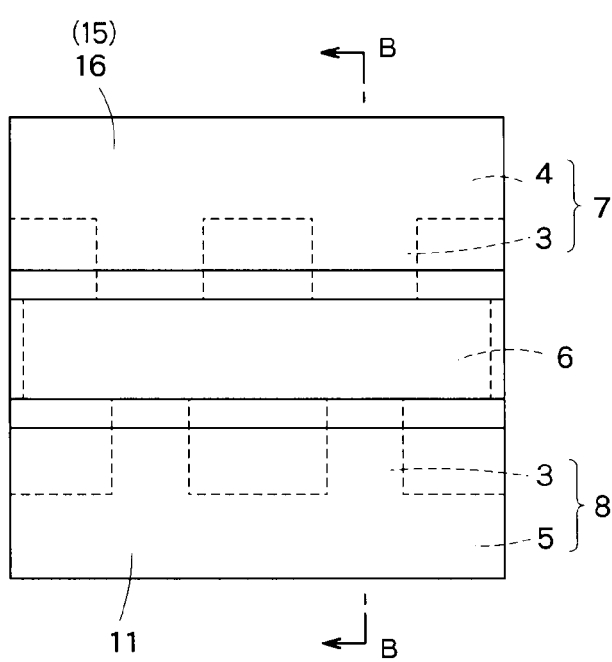

Accordingly, as shown in a plane view of FIG. 10C, the width of the fins 3 in the source region and the width of the first contact region 4 become wider, by which the resistance of the fins 3 in the source region 7 is decreased and as shown in FIG. 10C, the length of the fins 3 on the source side becomes shorter, thereby lowering the resistance of the fins 3 in the source region 7 more than that in the drain region 8.

Figure 10D:
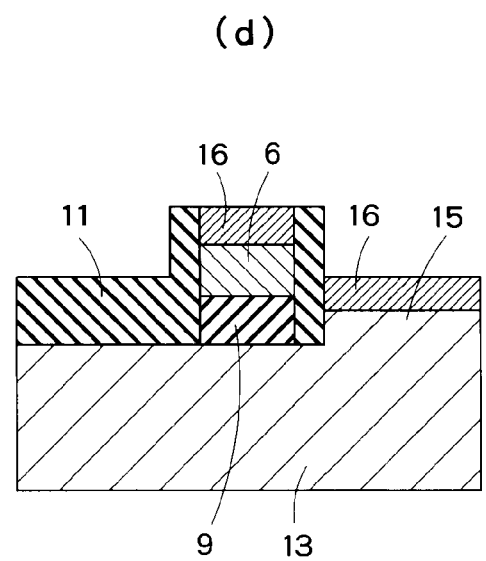

FIG. 10D is a sectional view along B-B in FIG. 10C. In the source region 7, an epitaxial growth layer 15 extends over the silicon layer 13, and the height of the fins 3 in the source region 7 becomes higher than that in the drain region 8, thereby lowering the resistance in the source region 7 more than that in the drain region 8.

As described above, by forming the epitaxial growth layer 15 on the source side, the resistance in the source region 7 can be surely lowered more than that in the drain region 8.

After the epitaxial growth layer 15 is formed, a silicide layer 16 is formed on the top surface of the epitaxial growth layer 15 by performing a silicide process. At this time, the silicide process is performed also on the top surface of the gate electrode 6.

By performing the above processes, the silicide layer 16 is formed on the source side while the silicide layer 16 is not formed on the drain side, by which the resistance value on the drain side becomes higher than that on the source side as a result.

In FIG. 10, the width and height of the silicon layer 13 on the source side are made larger than those on the drain side through the epitaxial growth, and the silicide layer 16 is selectively formed on the source side. However, Rd/Rs can be also set to 10 or more eventually by forming the silicide layer on both of the source side and the drain side, selectively making the epitaxial growth on the silicon layer on the source side, and changing the size of the fins 3 on the source side and that on the drain side in accordance with the above requirements (1) to (3).

As described above, in the transistor having the multiple fins 3 and the double gate structure according to the present embodiment, gm*rout expressed by the product of conductance gm and output resistance rout of the transistor can be increased by setting drain resistance Rd in the drain region 8 to 10 or more times larger than source resistance Rs in the source region 7, by which electric characteristics such as anti-noise performance, etc. can be improved. Therefore, the transistor according to the present embodiment can be widely used in constant current circuits, analog-digital converter circuits (ADC), tuners, etc.

What is claimed is:

1. A semiconductor device comprising:
   a plurality of fins formed on a semiconductor substrate to be separated from each other;
   a first contact region which connects commonly one end side of the plurality of fins;
   a second contact region which connects commonly the other end side of the plurality of fins;
   a gate electrode arranged to be opposed to at least both side surfaces of the plurality of fins by sandwiching a gate insulating film therebetween;
   a source electrode including the first contact region and the plurality of fins on a side closer to the first contact region than the gate electrode; and
   a drain electrode including the second contact region and the plurality of fins on a side closer to the second contact than the gate electrode, wherein a ratio Rd/Rs of a resistance Rd of each fin in the drain region to a resistance Rs of each fin in the source region is larger than 1.

2. The semiconductor device according to claim 1, wherein the Rd/Rs is 10 or more.

3. The semiconductor device according to claim 1, wherein a width of each fin in the source region is thicker than a width of each fin in the drain region.

4. The semiconductor device according to claim 1, wherein a length of each fin in the source region is shorter than a length of each fin in the drain region.

5. The semiconductor device according to claim 1, wherein a height of each fin in the source region is higher than a height of each fin in the drain region.

6. The semiconductor device according to claim 1, wherein each fin in the source region and the drain region has a semiconductor layer, and a silicide layer is provided on the semiconductor layer in accordance with only the source region among the plurality of fins in the source region and the drain region.

7. The semiconductor device according to claim 1, wherein:
   each fin in the source region and the drain region has a semiconductor layer; and
   the semiconductor layer is epitaxially grown in accordance with only the source region among the plurality of fins in the source region and the drain region.

8. The semiconductor device according to claim 7, further comprising a silicide layer formed on the semiconductor layer in accordance with both of the plurality of fins in the source region and the drain region, or in accordance with the plurality of fins in the source region.

9. The semiconductor device according to claim 1, wherein impurity concentration of the plurality of fins in the drain region is adjusted so that the Rd/Rs is 10 or more.

10. The semiconductor device according to claim 1, wherein the gate electrode is arranged to be opposed to side surfaces and upper surfaces of the plurality of fins so as to straddle the plurality of fins by sandwiching the gate insulating film therebetween.

11. A method of fabricating a semiconductor device comprising:
   forming a plurality of fins separated from each other, a first contact region connecting commonly one end side of the plurality of fins and a second contact region connecting commonly the other end side of the plurality of fins on a semiconductor substrate;
   forming a gate electrode to be arranged to be opposed to at least both side surfaces of the plurality of fins by sandwiching a gate insulating film therebetween; and
   adjusting at least one of the plurality of fins in the drain region and the source region so that a ratio Rd/Rs of a resistance Rd of each fin in the drain region including the second contact region and the plurality of fins on a side closer to the second contact region than the gate electrode to a resistance Rs of each fin in the source region including the first contact region and the plurality of fins on a side closer to the first contact region than the gate electrode becomes more than 1.

12. The method according to claim 11, wherein the Rd/Rs is 10 or more.

13. The method according to claim 11, wherein a width of each fin in the source region is thicker than a width of each fin in the drain region.

14. The method according to claim 11, wherein a length of each fin in the source region is shorter than a length of each fin in the drain region.

15. The method according to claim 11, wherein a height of each fin in the source region is higher than a height of each fin in the drain region.

16. The method according to claim 11, wherein each fin in the source region and the drain region has a semiconductor layer, and a silicide layer is provided on the semiconductor layer in accordance with only the source region among the plurality of fins in the source region and the drain region.

17. The method according to claim 11, wherein each fin in the source region and the drain region has a semiconductor layer, and the semiconductor layer is epitaxially grown in accordance with only the source region among the plurality of fins in the source region and the drain region.

18. The method according to claim 17, further comprising a silicide layer formed on the semiconductor layer in accordance with both of the plurality of fins in the source region and the drain region, or in accordance with the plurality of fins in the source region.

19. The method according to claim 11, wherein impurity concentration of the plurality of fins in the drain region is adjusted so that the Rd/Rs is 10 or more.

20. The method according to claim 11, wherein the gate electrode is arranged to be opposed to side surfaces and upper surfaces of the plurality of fins so as to straddle the plurality of fins by sandwiching the gate insulating film therebetween.

* * * * *